(12) United States Patent
Hasegawa

(10) Patent No.: US 9,853,234 B2
(45) Date of Patent: Dec. 26, 2017

(54) ORGANIC EL DEVICE AND METHOD FOR PRODUCING THE SAME

(71) Applicant: PANASONIC INTELLECTUAL PROPERTY MANAGEMENT CO., LTD., Osaka (JP)

(72) Inventor: Kazuya Hasegawa, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/318,485

(22) PCT Filed: Jun. 17, 2015

(86) PCT No.: PCT/JP2015/003027
§ 371 (c)(1),
(2) Date: Dec. 13, 2016

(87) PCT Pub. No.: WO2016/017061
PCT Pub. Date: Feb. 4, 2016

(65) Prior Publication Data
US 2017/0133619 A1 May 11, 2017

(30) Foreign Application Priority Data
Jul. 30, 2014 (JP) .................................. 2014-155295

(51) Int. Cl.
*H01L 51/52* (2006.01)
*H01L 27/32* (2006.01)
*H01L 51/56* (2006.01)

(52) U.S. Cl.
CPC ...... *H01L 51/5212* (2013.01); *H01L 27/3246* (2013.01); *H01L 27/3276* (2013.01);
(Continued)

(58) Field of Classification Search
None
See application file for complete search history.

(56) References Cited

U.S. PATENT DOCUMENTS 9,054,334 B2 6/2015 Nakamura et al.
9,461,264 B2 10/2016 Nakamura et al.
(Continued)

FOREIGN PATENT DOCUMENTS

JP 06-349578 12/1994
JP 2000-348859 12/2000
(Continued)

OTHER PUBLICATIONS

Search Report issued in International Patent Application No. PCT/JP2015/003027, dated Aug. 25, 2015.

*Primary Examiner* — Michelle Mandala
(74) *Attorney, Agent, or Firm* — Greenblum & Bernstein, P.L.C.

(57) ABSTRACT

An organic EL device includes: a first substrate and a second substrate; an organic light emitting portion including a first electrode, an organic layer and a second electrode; a sealing member surrounding the organic light emitting portion; a first electrode extraction portion; a second electrode extraction portion; an insulating layer that electrically insulates the first electrode and the second electrode; and a connecting portion that electrically connects the second electrode extraction portion and the second electrode. The insulating layer includes: a first insulating portion provided between the first electrode extraction portion and the organic layer; and a second insulating portion that is provided between the second electrode extraction portion and the organic layer and covered with the connecting portion. A distance between the sealing member and the first insulating portion is longer than a distance between the sealing member and the second insulating portion.

9 Claims, 13 Drawing Sheets

(52) U.S. Cl.
CPC ...... *H01L 27/3283* (2013.01); *H01L 27/3288* (2013.01); *H01L 51/5246* (2013.01); *H01L 51/5253* (2013.01); *H01L 51/56* (2013.01)

(56) References Cited

U.S. PATENT DOCUMENTS

| | | |
|---|---|---|
| 2008/0079360 A1 | 4/2008 | Kubota |
| 2013/0300284 A1* | 11/2013 | Nishido .............. H01L 51/0097 313/511 |

FOREIGN PATENT DOCUMENTS

| | | |
|---|---|---|
| JP | 2001-043971 | 2/2001 |
| JP | 2002-093574 | 3/2002 |
| JP | 2007-273409 | 10/2007 |
| JP | 2011-071028 | 4/2011 |

* cited by examiner

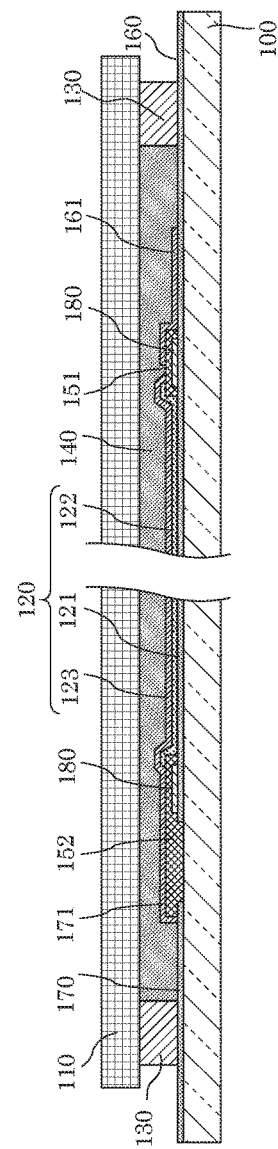

ORGANIC EL DEVICE AND METHOD FOR PRODUCING THE SAME

TECHNICAL FIELD

The present invention relates to an organic EL (electroluminescent) device and a method for producing the same.

BACKGROUND ART

Organic EL devices are light emitting devices that can be driven at a low voltage and a low current, and have advantages in that they have a large emission brightness with respect to supply power and good light emission efficiency. For this reason, conventionally, development has been made on various devices that use organic EL devices, for example, lighting apparatuses, display apparatuses and the like that use organic EL devices.

For example, Patent Literature (PTL) 1 discloses an organic EL device in which an EL stacked structure is provided on a transparent substrate. The EL stacked structure includes an anode, a cathode, an organic substance layer including a light emitting layer that is sandwiched between the anode and the cathode, and an anode insulating layer for insulating the anode from the cathode that is provided along the edge portion of the EL stacked structure. Also, the EL stacked structure is covered with a resin layer so as to be protected from moisture and the like.

CITATION LIST

Patent Literature

PTL 1: Japanese Unexamined Patent Application Publication No. 2000-348859

SUMMARY OF THE INVENTION

Technical Problem

However, with the conventional organic EL device described above, because the anode insulating layer has higher moisture permeability than the resin layer, the anode insulating layer draws moisture that has entered the organic EL device. That is, the anode insulating layer facilitates the moisture that has entered the organic EL device in reaching the light emitting layer. For this reason, the conventional organic EL device described above is problematic in that the light emitting layer degrades early and the lifetime of the organic EL device is shortened.

To address this, it is an object of the present invention to provide an organic EL device having a longer lifetime than a conventional organic EL device and a method for producing such an organic EL device.

Solution to Problem

In order to achieve the above object, an organic EL device according to an aspect of the present invention includes: a first substrate and a second substrate that are oppositely disposed; an organic light emitting portion provided between the first substrate and the second substrate, the organic light emitting portion including a first electrode, an organic layer including a light emitting layer, and a second electrode that are stacked in sequence on the first substrate; a sealing member that connects the first substrate and the second substrate and surrounds the organic light emitting portion; a first electrode extraction portion that is partly exposed outside the sealing member and is electrically connected to the first electrode; a second electrode extraction portion that is partly exposed outside the sealing member and is electrically connected to the second electrode; an insulating layer provided along an edge portion of the organic layer, the insulating layer electrically insulating the first electrode and the second electrode; and a connecting portion that electrically connects the second electrode extraction portion and the second electrode, and the insulating layer includes: a first insulating portion provided between the first electrode extraction portion and the organic layer; and a second insulating portion provided between the second electrode extraction portion and the organic layer, the second insulating portion being covered with the connecting portion, and a distance between the sealing member and the first insulating portion is longer than a distance between the sealing member and the second insulating portion.

Also, a method for producing an organic EL device according to an aspect of the present invention is a method for producing an organic EL device including an organic light emitting portion, the organic light emitting portion including a first electrode, an organic layer including a light emitting layer, and a second electrode that are stacked in sequence, the method including: forming, on a first substrate, the first electrode, a first electrode extraction portion electrically connected to the first electrode, and a second electrode extraction portion electrically connected to the second electrode; forming an insulating layer along an edge portion of the first electrode; forming the organic layer on the first electrode; forming the second electrode on the organic layer; forming a sealing member on at least one of the first substrate and a second substrate so as to surround the organic light emitting portion and cause the first electrode extraction portion and the second electrode extraction portion to be partly exposed outside the sealing member; and sealing the organic light emitting portion by laminating the first substrate and the second substrate, wherein the insulating layer includes: a first insulating portion provided between the first electrode extraction portion and the organic layer; and a second insulating portion provided between the second electrode extraction portion and the organic layer, in the forming of the second electrode, a connecting portion that electrically connects the second electrode and the second electrode extraction portion is further formed on the second insulating portion, and in the forming of the insulating layer, the insulating layer is formed such that a distance between the sealing member and the first insulating portion is longer than a distance between the sealing member and the second insulating portion.

Advantageous Effect of Invention

According to the present invention, it is possible to provide an organic EL device having a longer lifetime than a conventional organic EL device and a method for producing such an organic EL device.

BRIEF DESCRIPTION OF DRAWINGS

FIG. 5G is a schematic cross-sectional view showing a laminating step included in the method for producing an organic EL device according to Embodiment 1 of the present invention.

DESCRIPTION OF EXEMPLARY EMBODIMENTS

Figure 1:
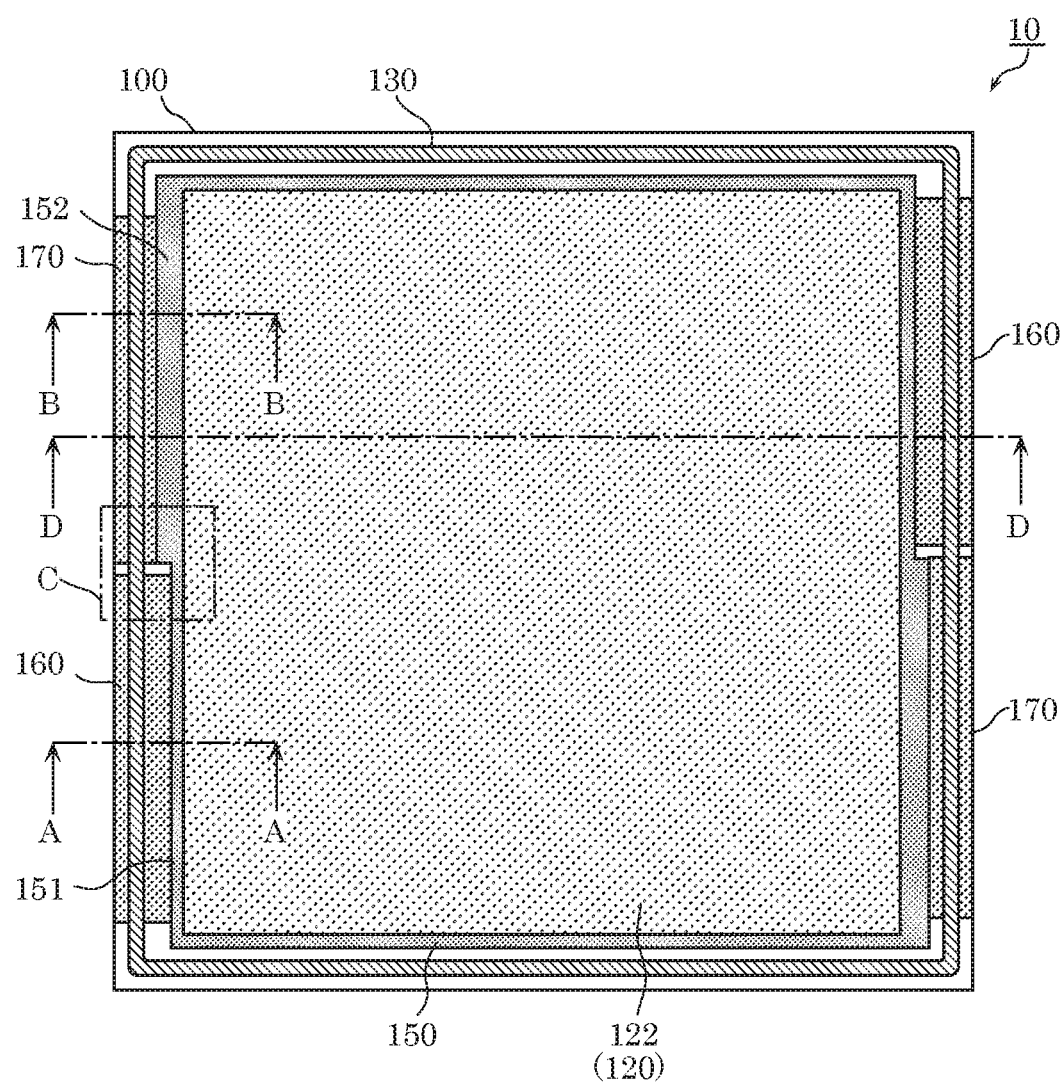
FIG. 1 is a schematic plan view showing an organic EL device according to Embodiment 1 of the present invention.

Hereinafter, an organic EL device and a method for producing the organic EL device according to an embodiment of the present invention will be described in detail with reference to the drawings. Note that the embodiments described below show preferred specific examples of the present invention. Accordingly, the numerical values, shapes, materials, structural elements, the arrangement and connection of the structural elements, and the like shown in the following embodiments are merely examples, and therefore do not limit the scope of the present invention. Accordingly, among the structural elements described in the following embodiments, structural elements not recited in any one of the independent claims are described as arbitrary structural elements.

In addition, the diagrams are schematic representations, and thus are not necessarily true to scale. Also, in the diagrams, structural elements that are the same are given the same reference numerals.

Embodiment 1

[Organic EL Device]

First, a configuration of an organic EL device according to Embodiment 1 will be described with reference to FIGS. 1 to 4.

Figure 2:
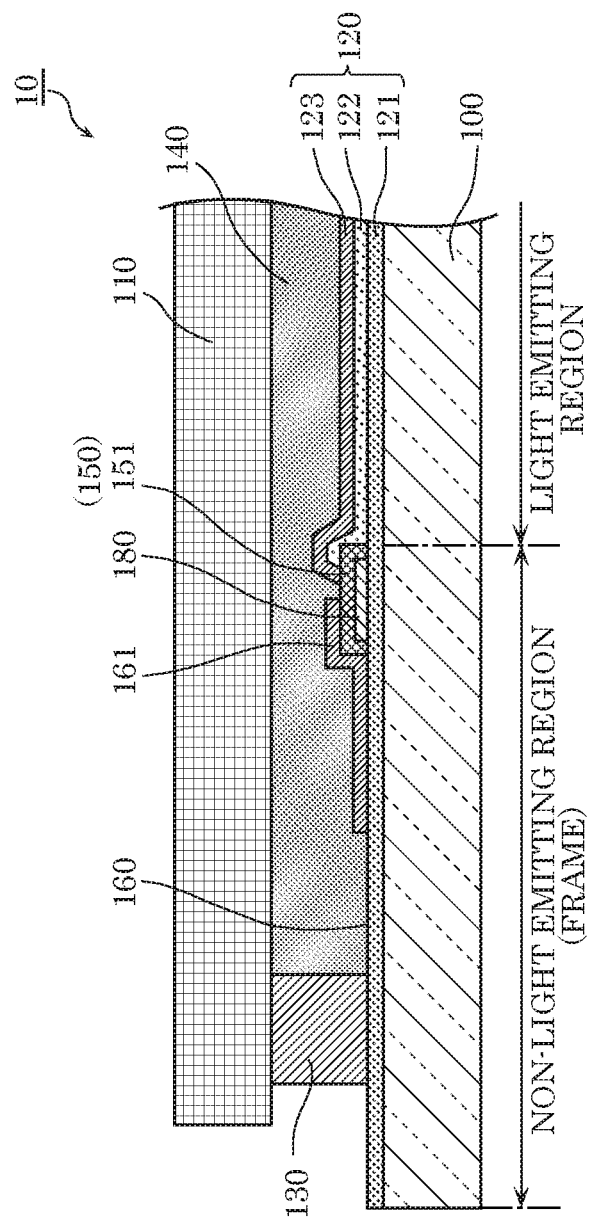
FIG. 2 is a schematic cross-sectional view showing a cross section passing through a first electrode extraction portion according to Embodiment 1 of the present invention, the cross section being taken along the line A-A.
Figure 3:
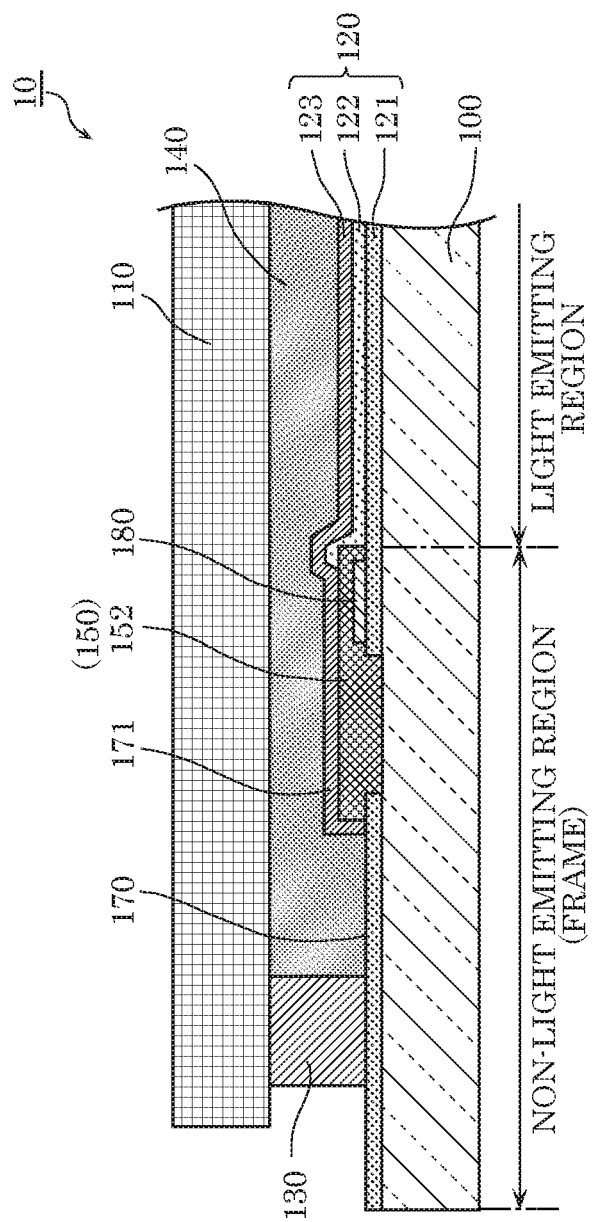
FIG. 3 is a schematic cross-sectional view showing a cross section passing through a second electrode extraction portion according to Embodiment 1 of the present invention, the cross section being taken along the line B-B.
Figure 4:
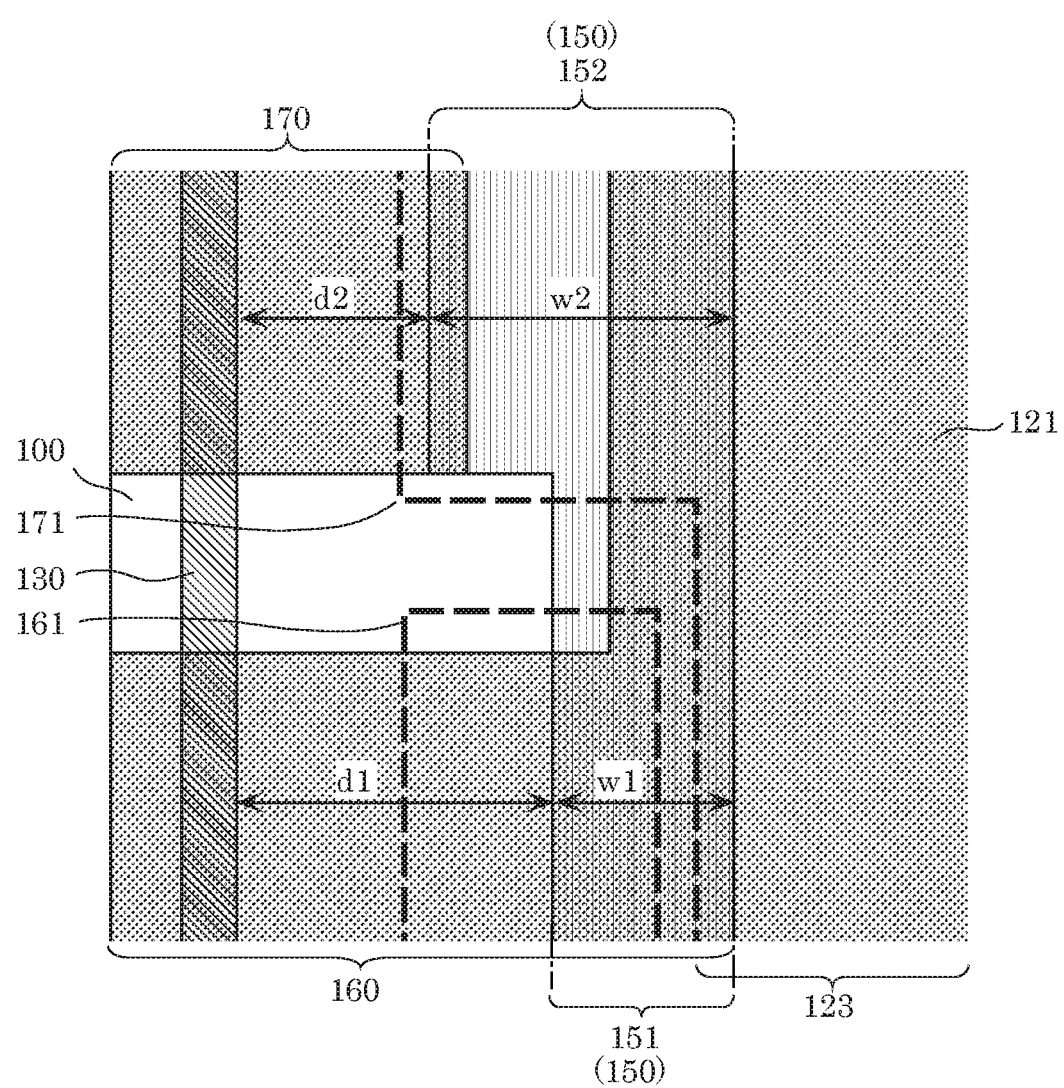
FIG. 4 is a schematic plan view showing a region (C region) in the vicinity of a boundary between the first electrode extraction portion and the second electrode extraction portion according to Embodiment 1 of the present invention.

FIG. 1 is a schematic plan view showing organic EL device 10 according to the present embodiment. FIG. 2 is a schematic cross-sectional view showing a cross section passing through first electrode extraction portion 160 according to the present embodiment, the cross section being taken along the line A-A shown in FIG. 1. FIG. 3 is a schematic cross-sectional view showing a cross section passing through second electrode extraction portion 170 according to the present embodiment, the cross section being taken along the line B-B shown in FIG. 1. FIG. 4 is a schematic plan view showing a region (C region shown in FIG. 1) in the vicinity of a boundary between first electrode extraction portion 160 and second electrode extraction portion 170 according to the present embodiment.

As shown in FIG. 1, organic EL device 10 is, for example, a planar light emitter having a substantially rectangular shape. Organic EL device 10 provides, for example, a substantially rectangular planar light emission in the depth direction on the sheet of FIG. 1. That is, organic EL device 10 includes, in plan view, a substantially rectangular light emitting region (corresponding to organic light emitting portion 120 shown in FIG. 1) and a non-light emitting region (so-called frame) that surrounds the light emitting region.

As shown in FIGS. 1 to 3, organic EL device 10 includes first substrate 100, second substrate 110, organic light emitting portion 120, sealing member 130, filling member 140, insulating layer 150, first electrode extraction portion 160, protective film 161, second electrode extraction portion 170, connecting portion 171, and auxiliary electrode 180. Also, as shown in FIGS. 2 and 3, organic light emitting portion 120 includes first electrode 121, organic layer 122, and second electrode 123.

For the sake of clear understanding of the shape and positional relationship in plan view of organic light emitting portion 120, sealing member 130 and insulating layer 150, in FIG. 1, second substrate 110, filling member 140, protective film 161, connecting portion 171 and auxiliary electrode 180 are not shown. Also, in FIG. 4, the edge portions of protective film 161, connecting portion 171 and second electrode 123 are indicated by thick and long broken lines. Also, in FIG. 4, second substrate 110, organic layer 122, filling member 140 and auxiliary electrode 180 are not shown.

[Substrate]

First substrate 100 and second substrate 110 are oppositely disposed. To be specific, first substrate 100 and second substrate 110 are disposed so as to oppose each other with a predetermined distance therebetween. For example, the distance between first substrate 100 and second substrate 110 ranges from 6 to 100 μm, and can be 20 μm, for example. First substrate 100 and second substrate 110 are bonded with sealing member 130.

Organic light emitting portion 120 is disposed between first substrate 100 and second substrate 110. A space between first substrate 100 and second substrate 110 is filled with filling member 140 that covers and protects organic light emitting portion 120.

First substrate 100 is light transmissive, and transmits at least a part of visible light. First substrate 100 is, for example, a glass substrate made of soda glass, alkali-free glass or the like, or a resin substrate made of a light transmissive resin material such as polycarbonate resin, acrylic resin or the like. For example, as first substrate 100, from the viewpoint of ease of handing and mechanical characteristics, a plate-like transparent substrate 5 having a thickness of 0.03 to 1.2 mm can be used.

Second substrate 110 is, for example, light transmissive, and transmits at least a part of visible light. For example, second substrate 110 is made of the same material as that of first substrate 100. Alternatively, second substrate 110 may be light reflective. To be specific, second substrate 110 may be made of a metal material such as stainless steel or aluminum.

As shown in FIG. 1, first substrate 100 has a substantially rectangular shape as viewed in plan view. Likewise, second substrate 110 also has a substantially rectangular shape as viewed in plan view. In organic EL device 10 according to the present embodiment, for example, as shown in FIGS. 2 and 3, first substrate 100 has a substantially rectangular shape that is larger than that of second substrate 110. Second substrate 110 may have the same size as that of first substrate 100, to be specific, may have the same shape, or may be larger than first substrate 100.

[Organic Light Emitting Portion]

Organic light emitting portion 120 provides a planar light emission upon application of voltage. First electrode 121, organic layer 122 and second electrode 123 that are included in organic light emitting portion 120 are stacked in this order on first substrate 100.

As shown in FIG. 1, as with first substrate 100, organic light emitting portion 120 has a substantially rectangular shape as viewed in plan view. Organic light emitting portion 120 has a shape as viewed in plan view that is smaller than those of first substrate 100 and second substrate 110. Insulating layer 150, sealing member 130, first electrode extraction portion 160 and second electrode extraction portion 170 are formed around organic light emitting portion 120.

First electrode 121 is an electrode provided on the light emitting surface side, and is provided on, for example, first substrate 100. First electrode 121 is, for example, an anode, and has a higher potential than that of second electrode 123 when organic EL device 10 emits light.

First electrode 121 is made of a light transmissive conductive material. For example, first electrode 121 is made of a transparent conductive material that transmits at least a part of visible light. First electrode 121 is made of, for example, indium tin oxide (ITO), indium zinc oxide (IZO), aluminum-doped zinc oxide (AZO) or the like.

First electrode 121 may be a metal thin film that is made of silver, aluminum or the like and has a thickness that allows light to pass therethrough. Alternatively, Ag nanowires or Ag particles may be dispersed. Alternatively, it is also possible to use, as first electrode 121, a conductive polymer such as PEDOT or polyaniline, a conductive polymer doped with an arbitrary acceptor, or a conductive light transmissive material such as a carbon nanotube.

For example, first electrode 121 is formed by depositing a transparent conductive film onto first substrate 100 by a vapor deposition method, an application method, a sputtering method, an ion beam-assisted deposition method or the like, and patterning the deposited transparent conductive film. For example, first electrode 121 has a thickness of 60 to 200 nm, and the thickness can be, for example, 100 nm.

Organic layer 122 is provided between first electrode 121 and second electrode 123. Organic layer 122 includes a light emitting layer, and provides a planar light emission in response to the application of voltage between first electrode 121 and second electrode 123.

To be specific, organic layer 122 includes a positive hole injecting layer, a positive hole transporting layer, a light emitting layer (organic EL layer), an electron transporting layer and an electron injecting layer. Organic layer 122 such as a light emitting layer is made of, for example, an organic material such as diamine, anthracene or a metal complex. Each layer constituting organic layer 122 is formed by a vapor deposition method, a spin coating method, a casting method, an ion beam-assisted deposition method or the like. For example, organic layer 122 has a thickness of 150 to 350 nm, and the thickness can be, for example, 210 nm.

For example, in the case where the emission color is white, organic layer 122 is formed by doping a light emitting layer with three dopant colorants, namely, red, green and blue colorants. Alternatively, organic layer 122 may have a stacked structure including a blue positive hole transporting light emitting layer, a green electron transporting light emitting layer and a red electron transporting light emitting layer. Also, organic layer 122 may have a multi-unit structure in which a red light emitting unit, a green light emitting unit and a blue light emitting unit are stacked via light transmissive conductive intermediate layers and are directly electrically connected.

Second electrode 123 is an electrode provided on the opposite side of the light emitting surface, and is provided on, for example, organic layer 122. Second electrode 123 is, for example, a cathode, and has a lower potential than that of first electrode 121 when organic EL device 10 emits light.

Second electrode 123 is made of a light reflective conductive material. Second electrode 123 reflects light emitted from organic layer 122 so as to cause the light to exit on the light emitting surface side. Second electrode 123 is made of, for example, a metal material such as aluminum, silver or magnesium, or an alloy containing at least one of the metals listed above. For example, second electrode 123 is formed by depositing a conductive film onto organic layer 122 by a vapor deposition method, an application method, a sputtering method, an ion beam-assisted deposition method, GCIB (gas cluster ion beam) vapor deposition or the like. For example, second electrode 123 has a thickness of 20 to 200 nm, and the thickness can be, for example, 100 nm.

Because metal materials have a low moisture permeability, second electrode 123 can protect organic layer 122 from moisture. Second electrode 123 may be made of, for example, a conductive resin material. However, in this case, second electrode 123 is made of a material having a lower moisture permeability than that of insulating layer 150.

Also, second electrode 123 may be made of a light transmissive conductive material. For example, as second electrode 123, the same material as that of first electrode 121 can be used. In this case, if second substrate 110 is also made of a light transmissive material, organic EL device 10 can be used as a double-sided light emitting lighting apparatus in for example, a building window, a vehicle window or the like.

[Sealing Member]

Sealing member 130 is a connecting member for connecting first substrate 100 and second substrate 110. For example, sealing member 130 is an adhesive that bonds first substrate 100 and second substrate 110. As shown in FIG. 1, sealing member 130 is disposed along the outer periphery of first substrate 100 so as to surround organic light emitting portion 120 as viewed in plan view. With this configuration, it is possible to seal organic light emitting portion 120 in a space (hereinafter referred to as "sealed space") surrounded by first substrate 100, second substrate 110 and sealing member 130.

As shown in FIG. 1, sealing member 130 is formed to have an annular shape as viewed in plan view. For example, sealing member 130 is a substantially rectangular frame-shaped body as viewed in plan view. To be specific, sealing member 130 is provided along the outer periphery of substantially rectangular first substrate 100 so as to have a substantially rectangular frame shape. For example, the line width (or in other words, sealing width) of sealing member 130 is substantially constant.

As sealing member 130, it is possible to use, for example, an optically curable, thermally curable or two-part curable adhesive resin such as an epoxy resin, an acrylic resin or a silicone resin. Alternatively, as sealing member 130, it is also possible to use a thermoplastic adhesive resin or the like that is made of an acid-modified resin such as polyethylene or polypropylene.

Sealing member 130 may contain an inorganic filling member and the like. By doing so, the permeability of moisture entering from the outside can be further reduced. The inorganic filling member can be, for example, silica, calcium hydroxide, calcium carbonate, any other resin material or the like.

As sealing member 130, for example, a material having a higher viscosity than that of filling member 140 is used. By doing so, sealing member 130 functions as a dam material during application of filling member 140. That is, by applying filling member 140 after application of sealing member 130, it is possible to prevent filling member 140 from leaking out of the region surrounded by sealing member 130.

Sealing member 130 is formed by applying a sealing member material made of a resin material and curing the sealing member material. The sealing member material is applied by, for example, a printing method such as roll coating, spin coating, screen printing, spray coating, slit coating or squeegee application, or a drawing/applying method using a dispenser according to the viscosity and thickness of the resin material.

[Filling Member]

Filling member 140 is a member for sealing organic light emitting portion 120. For example, filling member 140 is provided between first substrate 100 and second substrate 110 so as to be in contact with and cover organic light emitting portion 120. To be specific, filling member 140 is made of a resin material charged into the sealed space and then cured.

As filling member 140, it is possible to use, for example, an optically curable, thermally curable or two-part curable adhesive resin such as an epoxy resin, an acrylic resin or a silicone resin. Alternatively, as filling member 140, it is also possible to use a thermoplastic adhesive resin or the like made of an acid-modified resin such as polyethylene or polypropylene.

Also, filling member 140 may contain a desiccating agent. The desiccating agent can be, for example, a moisture-absorbing material having micropores that adsorb moisture. To be specific, the desiccating agent can be calcium oxide (CaO), zeolite or the like. It is preferable to use, as the desiccating agent, a material having a higher moisture-absorbing capacity.

Filling member 140 is formed by applying a filling member material made of a resin material and curing the filling member material. The filling member material is applied by, for example, a printing method such as roll coating, spin coating, screen printing, spray coating, slit coating or squeegee application, or a drawing/applying method using a dispenser according to the viscosity and thickness of the resin material.

[Insulating Layer]

Insulating layer 150 is provided along the edge portion of organic layer 122 and provides electrical insulation between first electrode 121 and second electrode 123. Insulating layer 150 is in contact with the edge portion of organic layer 122. Insulating layer 150 covers the edge portion of organic layer 122, together with second electrode 123, such that the edge portion of organic layer 122 is not exposed. The edge portion of organic layer 122 corresponds to the boundary portion between the light emitting region and the non-light emitting region in organic EL device 10.

Insulating layer 150 is made of, for example, an insulating resin material such as polyimide. For example, insulating layer 150 is formed by applying an insulating resin material and curing the insulating resin material. Insulating layer 150 may be made of an inorganic material such as a nitride film.

As shown in FIG. 1, insulating layer 150 includes first insulating portion 151 and second insulating portion 152. The structures of first insulating portion 151 and second insulating portion 152 will be described later in detail.

[Electrode Extraction Portion]

First electrode extraction portion 160 and second electrode extraction portion 170 are provided so as to be partly exposed outside sealing member 130. For example, as shown in FIG. 1, first electrode extraction portion 160 and second electrode extraction portion 170 are provided along a portion of the periphery of first substrate 100. To be specific, as viewed in plan view, first electrode extraction portion 160 and second electrode extraction portion 170 are provided so as to be respectively on two opposing sides of substantially rectangular first substrate 100. For example, first electrode extraction portion 160 and second electrode extraction portion 170 are each disposed point-symmetrically disposed about the center of first substrate 100 that serves as the center of symmetry. It is thereby possible to suppress a voltage drop within the planes of first electrode 121 and second electrode 123 and improve surface uniformity of light emission.

First electrode extraction portion 160 and second electrode extraction portion 170 are made of the same material as that of first electrode 121. For example, first electrode extraction portion 160 and second electrode extraction portion 170 are formed simultaneously, together with first electrode 121, by depositing a conductive film onto first substrate 100 and patterning the conductive film.

First electrode extraction portion 160 is, for example, an anode extraction electrode and is electrically connected to first electrode 121. To be specific, as shown in FIG. 2, first electrode extraction portion 160 is formed as an extension portion of first electrode 121. That is, first electrode extraction portion 160 is a conductive film formed unitarily with first electrode 121.

In the present embodiment, in the unitarily formed conductive film, first electrode 121 is a portion located in the light emitting region, and first electrode extraction portion 160 is a portion located in the non-light emitting region. Accordingly, for example, first insulating portion 151 of insulating layer 150 is provided on first electrode extraction portion 160 along the edge portion of first electrode 121.

Also, as shown in FIG. 2, protective film 161 covering first insulating portion 151 is formed on first insulating portion 151. Protective film 161 is, for example, a conductive film having a lower moisture permeability than that of first insulating portion 151. Protective film 161 protects first insulating portion 151 from moisture. As a result of first insulating portion 151 being covered with protective film 161, it is possible to suppress a situation in which moisture that has entered the sealed space is drawn into first insulating portion 151, and therefore extend the lifetime of organic EL device 10.

Also, protective film 161 is made of, for example, a material having a higher conductivity than that of first electrode extraction portion 160. Here, as shown in FIG. 2, protective film 161 is provided so as to be in contact with first electrode extraction portion 160, and thus functions as an auxiliary electrode of first electrode extraction portion 160. With this configuration, it is possible to suppress a voltage drop within first electrode extraction portion 160 and improve surface uniformity of light emission.

Protective film 161 is made of, for example, the same material as that of second electrode 123. To be specific, protective film 161 is formed simultaneously with second electrode 123. For example, connecting portion 171 and protective film 161 are formed simultaneously, together with second electrode 123, by depositing a conductive film onto organic layer 122 and insulating layer 150 and patterning the conductive film.

As shown in FIG. 4, protective film 161 is spaced apart from second electrode 123 and connecting portion 171. To be specific, an insulation groove is formed between protective film 161 and second electrode 123 and between protective film 161 and connecting portion 171. In other words, protective film 161 is formed in the form of islands. With this configuration, protective film 161 is electrically insulated from second electrode 123 and second electrode extraction portion 170.

Since protective film 161 is spaced apart from second electrode 123, first insulating portion 151 is partly exposed within the sealed space. That is, first insulating portion 151 is partly in contact with filling member 140.

Second electrode extraction portion 170 is, for example, a cathode extraction electrode, and is electrically connected to second electrode 123. To be specific, as shown in FIG. 3, second electrode extraction portion 170 is electrically connected to second electrode 123 via connecting portion 171.

As shown in FIG. 4, second electrode extraction portion 170 is spaced apart from first electrode 121 and first electrode extraction portion 160. To be specific, an insulation groove is formed between second electrode extraction portion 170 and first electrode 121 and between second electrode extraction portion 170 and first electrode extraction portion 160. In other words, second electrode extraction portion 170 is formed in the form of islands. With this configuration, second electrode extraction portion 170 is electrically insulated from first electrode 121 and first electrode extraction portion 160.

Connecting portion 171 is an extension portion of second electrode 123. That is, connecting portion 171 is a conductive film formed unitarily with second electrode 123. Accordingly, connecting portion 171 is made of the same material as that of second electrode 123.

Connecting portion 171 is formed on second insulating portion 152. As with protective film 161, connecting portion 171 protects second insulating portion 152 from moisture. As a result of second insulating portion 152 being covered with connecting portion 171, it is possible to suppress a situation in which moisture that has entered the sealed space is drawn into second insulating portion 152, and therefore extend the lifetime of organic EL device 10.

[Auxiliary Electrode]

Auxiliary electrode 180 is made of a material having a higher conductivity than that of first electrode 121. For example, auxiliary electrode 180 is made of a metal material. Auxiliary electrode 180 is made of, for example, a molybdenum/aluminum/molybdenum stacked structure. For example, auxiliary electrode 180 is formed by stacking metal thin films by a vapor deposition method, an application method, a sputtering method, an ion beam-assisted deposition method or the like and pattering the metal thin films.

Auxiliary electrode 180 is provided along the periphery of first electrode 121. To be specific, auxiliary electrode 180 is formed along the periphery of first electrode 121 so as to have an annular shape. Auxiliary electrode 180 is electrically connected to first electrode 121. To be specific, as shown in FIGS. 2 and 3, auxiliary electrode 180 is provided on first electrode 121 and on first electrode extraction portion 160.

With auxiliary electrode 180 provided in an annular shape, for example, as shown in FIG. 1, power supplied from both sides of organic EL device 10 can be efficiently transferred along the periphery of first electrode 121. That is, the voltage drop within first electrode 121 can be suppressed, and surface uniformity of light emission can be enhanced.

[First Insulating Portion and Second Insulating Portion]

As shown in FIG. 1, insulating layer 150 is formed to have an annular shape as viewed in plan view. For example, insulating layer 150 is a substantially rectangular frame-shaped body as viewed in plan view. To be specific, insulating layer 150 is provided along sealing member 130 inside annular sealing member 130.

First insulating portion 151 of insulating layer 150 is a portion provided between first electrode extraction portion 160 and organic layer 122. To be specific, as shown in FIG. 2, first insulating portion 151 is provided on first electrode extraction portion 160 along the edge portion of first electrode 121.

Second insulating portion 152 of insulating layer 150 is a portion provided between second electrode extraction portion 170 and organic layer 122. To be specific, as shown in FIG. 3, second insulating portion 152 is provided along the edge portion of first electrode 121 so as to cover the edge portion of second electrode extraction portion 170 and the edge portion of first electrode 121.

As shown in FIG. 4, distance d1 between sealing member 130 and first insulating portion 151 is longer than distance d2 between sealing member 130 and second insulating portion 152. That is, first insulating portion 151 is provided at a position farther away from sealing member 130 than second insulating portion 152. For example, distance d1 is 2.3 to 2.5 mm, and distance d2 is 1.7 to 1.9 mm.

Also, as shown in FIG. 4, line width w1 of first insulating portion 151 is shorter than line width w2 of second insulating portion 152. For example, line width w1 is 0.4 to 0.6 mm, and line width w2 is 0.9 to 1.1 mm.

First insulating portion 151 and second insulating portion 152 are formed by, for example, drawing/applying an insulating resin material such as polyimide so as to form an annular shape by using a dispenser or the like. For example, first insulating portion 151 is formed by one line worth of drawing, and second insulating portion 152 is formed by two lines worth of drawing. That is, for example, line width w2 of second insulating portion 152 is substantially twice line width w1 of first insulating portion 151.

To be specific, first, an annular frame extending along the edge portion of organic layer 122 is drawn by using an insulating resin material such as polyimide. Next, a line extending along a part of the frame is drawn so as to be in contact with the outer side of the drawn frame. At this time, the same amount of drops is used when the frame is drawn and when the line extending along a part of the frame is drawn. After completion of drawing, the insulating resin material is cured by light irradiation, and thereby insulating layer 150 including first insulating portion 151 and second insulating portion 152 is formed.

At the time of drawing, the amount of drops or the drawing speed may be changed. For example, an insulating resin material may be drawn/applied, by using a predetermined amount of drops, in the region where first insulating portion 151 is to be formed, and the insulating resin material may be drawn/applied, by using an amount of drops that is (for example, twice) greater than the predetermined amount of drops, in the region where second insulating portion 152 is to be formed.

Alternatively, for example, an insulating resin material may be drawn/applied at a predetermined drawing speed in the region where first insulating portion 151 is to be formed, and the insulating resin material may be drawn/applied at a drawing speed (for example, twice) lower than the drawing speed in the region where second insulating portion 152 is to be formed. The drawing speed refers to, for example, the moving speed of a nozzle that ejects the insulating resin material.

[Method for Producing Organic EL Device]

Next, a method for producing organic EL device 10 according to the present embodiment will be described with reference to FIGS. 5A to 5G.

FIGS. 5A to 5G are schematic cross-sectional views respectively showing a step of forming first electrode 121, a step of forming auxiliary electrode 180, a step of forming insulating layer 150, a step of forming organic layer 122, a step of forming second electrode 123, a step of applying a sealing member material and a filling member material, and a laminating step in the method for producing organic EL device 10 according to the present embodiment. Note that FIGS. 5A to 5G show, for example, production steps in cross section taken along the line D-D shown in FIG. 1.

Figure 5A:
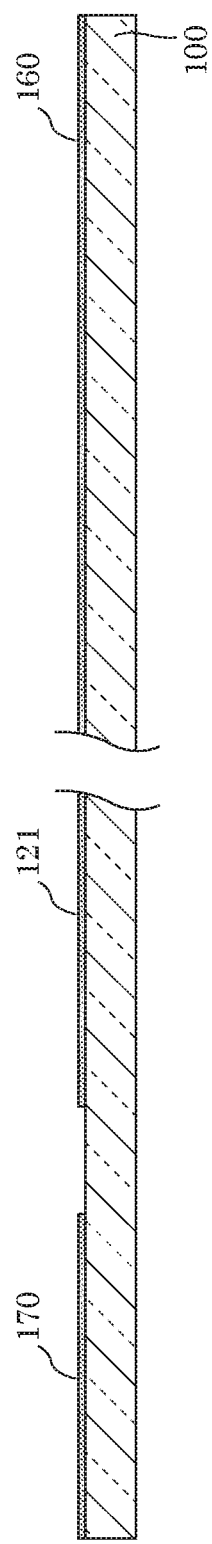
FIG. 5A is a schematic cross-sectional view showing a first electrode forming step included in a method for producing an organic EL device according to Embodiment 1 of the present invention.

First, in the step (first step) shown in FIG. 5A, first electrode 121, first electrode extraction portion 160 and second electrode extraction portion 170 are formed on first substrate 100. For example, first electrode 121, first electrode extraction portion 160 and second electrode extraction portion 170 are formed simultaneously by using the same material. To be specific, a transparent conductive film made of ITO or the like is deposited onto the entire surface of first substrate 100, which is then patterned so as to form first electrode 121, first electrode extraction portion 160 and second electrode extraction portion 170.

Figure 5B:
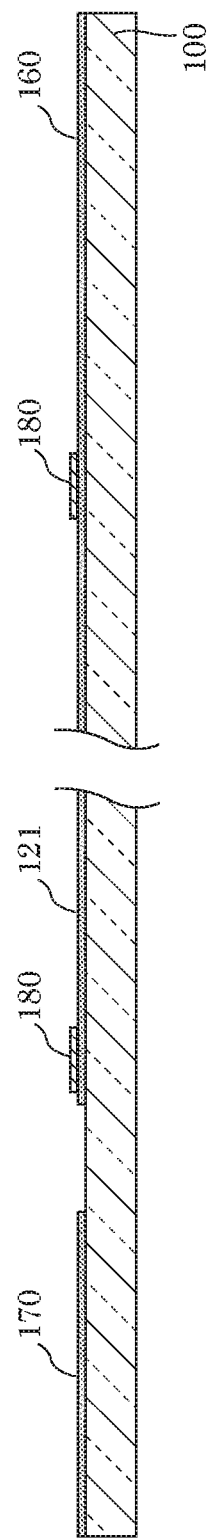
FIG. 5B is a schematic cross-sectional view showing an auxiliary electrode forming step included in the method for producing an organic EL device according to Embodiment 1 of the present invention.

Next, in the step shown in FIG. 5B, auxiliary electrode 180 is formed on first electrode 121 so as to extend along the edge portion of first electrode 121. For example, a molybdenum film, an aluminum film, a molybdenum film are stacked in sequence and then patterned. Auxiliary electrode 180 is thereby formed.

Figure 5C:
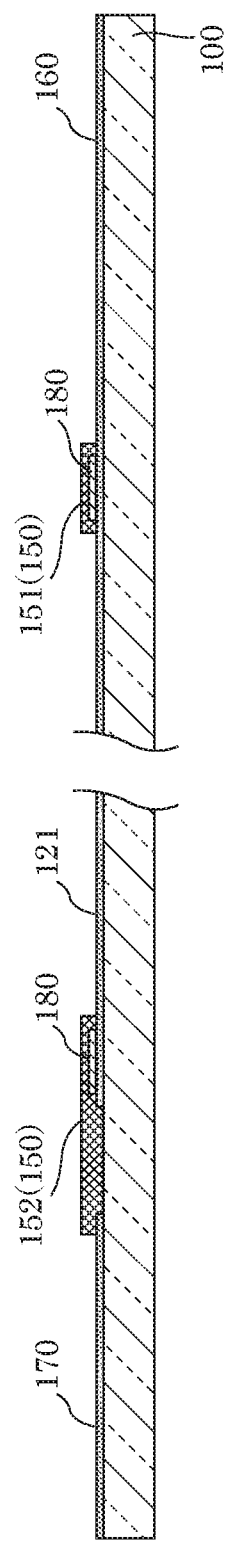
FIG. 5C is a schematic cross-sectional view showing an insulating layer forming step included in the method for producing an organic EL device according to Embodiment 1 of the present invention.

Next, in the step (second step) shown in FIG. 5C, insulating layer 150 is formed along the edge portion of first electrode 121. To be specific, insulating layer 150 is formed so as to cover auxiliary electrode 180. At this time, first insulating portion 151 is formed in the vicinity of first electrode extraction portion 160, and second insulating portion 152 is formed in the vicinity of second electrode extraction portion 170.

For example, first insulating portion 151 and second insulating portion 152 are formed by applying an insulating resin material by using a dispenser or the like and curing the insulating resin material. At this time, insulating layer 150 is formed such that the distance between sealing member 130 and first insulating portion 151 is longer than the distance between sealing member 130 and second insulating portion 152. In other words, insulating layer 150 is formed such that first insulating portion 151 is formed at a position farther away from sealing member 130 than second insulating portion 152.

To be specific, insulating layer 150 is formed such that the line width of second insulating portion 152 is thicker than the line width of first insulating portion 151. As described above, first insulating portion 151 and second insulating portion 152 are formed so as to have different line widths by changing, for example, the number of lines applied, the amount of application or the drawing speed.

Figure 5D:
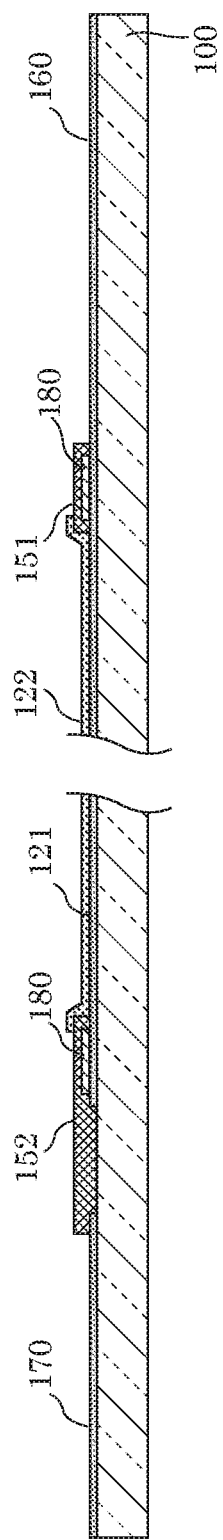
FIG. 5D is a schematic cross-sectional view showing an organic layer forming step included in the method for producing an organic EL device according to Embodiment 1 of the present invention.

Next, in the step (third step) shown in FIG. 5D, organic layer 122 is formed on first electrode 121. At this time, the edge portion of organic layer 122 may be formed on insulating layer 150. For example, organic layer 122 is formed by stacking functional layers containing a light emitting layer by a vapor deposition method or the like.

Figure 5E:
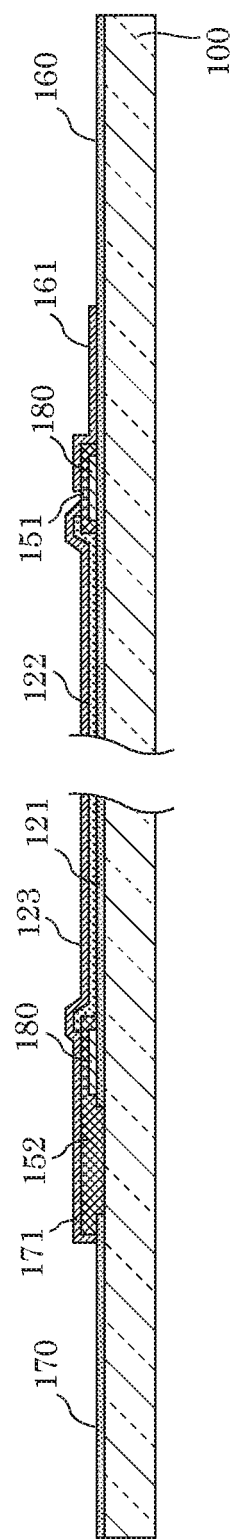
FIG. 5E is a schematic cross-sectional view showing a second electrode forming step included in the method for producing an organic EL device according to Embodiment 1 of the present invention.

Next, in the step (fourth step) shown in FIG. 5E, second electrode 123 is formed on organic layer 122. In this step, furthermore, connecting portion 171 is formed on second insulating portion 152, and protective film 161 is formed on first insulating portion 151. For example, second electrode 123, protective film 161 and connecting portion 171 are formed simultaneously by using the same material. To be specific, a metal thin film made of aluminum or the like is deposited onto the entire surface, which is then patterned so as to form second electrode 123, connecting portion 171 and protective film 161.

Figure 5F:
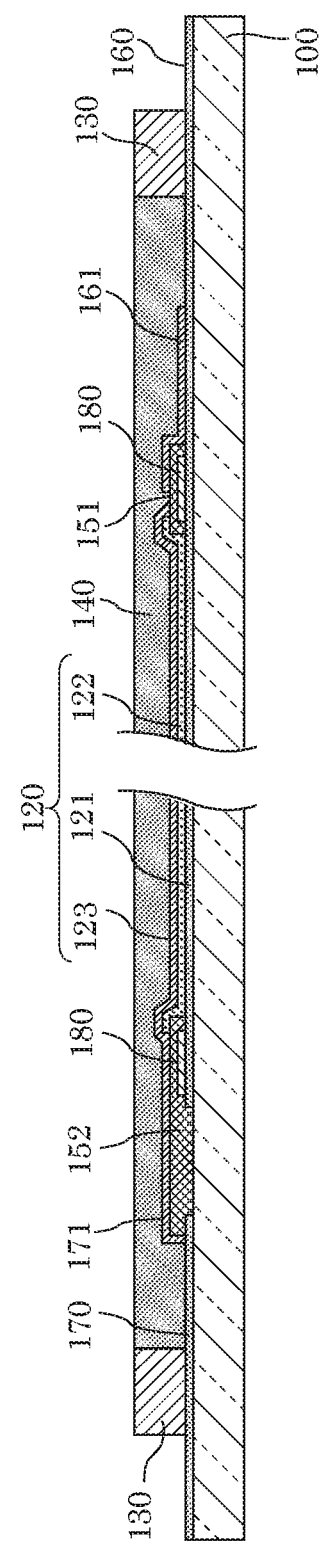
FIG. 5F is a schematic cross-sectional view showing a step of applying a sealing member material and a filling member material included in the method for producing an organic EL device according to Embodiment 1 of the present invention.

Next, in the step (fifth step) shown in FIG. 5F, sealing member 130 and filling member 140 are formed. To be specific, a sealing member material is applied onto first substrate 100 so as to surround organic light emitting portion 120 and cause first electrode extraction portion 160 and second electrode extraction portion 170 to be partly exposed outside. Furthermore, a filling member material is applied to a space (to be specific, sealed space) surrounded by sealing member 130. Sealing member 130 and filling member 140 are formed by curing the sealing member material and the filling member material after first substrate 100 and second substrate 110 have been laminated. In this step, the sealing member material may be applied to second substrate 110.

Next, in the step (sixth step) shown in FIG. 5G, as a result of first substrate 100 and second substrate 110 being laminated, organic light emitting portion 120 is sealed. For example, first substrate 100 and second substrate 110 are temporarily laminated under predetermined vacuum, and thereafter the vacuum state is gradually vented to atmosphere to fixedly laminate first substrate 100 and second substrate 110.

[Summation]

As described above, organic EL device 10 according to the present embodiment includes: first substrate 100 and second substrate 110 that are oppositely disposed; organic light emitting portion 120 provided between first substrate 100 and second substrate 110, the organic light emitting portion 120 including first electrode 121, organic layer 122 including a light emitting layer, and second electrode 123 that are stacked in sequence on first substrate 100; sealing member 130 that connects first substrate 100 and second substrate 110 and is provided so as to surround organic light emitting portion 120; first electrode extraction portion 160 is partly exposed outside sealing member 130 and is electrically connected to first electrode 121; second electrode extraction portion 170 that is partly exposed outside sealing member 130 and is electrically connected to second electrode 123; insulating layer 150 that is provided along an edge portion of organic layer 122 and electrically insulate first electrode 121 and second electrode 123; and connecting portion 171 that electrically connects second electrode extraction portion 170 and second electrode 123, wherein insulating layer 150 includes: first insulating portion 151 provided between first electrode extraction portion 160 and organic layer 122; and second insulating portion 152 that is provided between second electrode extraction portion 170 and organic layer 122 and is covered with connecting portion 171, and a distance between sealing member 130 and first insulating portion 151 is longer than a distance between sealing member 130 and second insulating portion 152.

Because second insulating portion 152 is protected by connecting portion 171, moisture that has entered the sealed space is hardly drawn into second insulating portion 152. On the other hand, as shown in FIG. 4, it is possible to provide protective film 161 on first insulating portion 151, but first insulating portion 151 is partially exposed within the sealed space in order to ensure the insulating property between protective film 161 and second electrode 123. Accordingly, first insulating portion 151 draws moisture from the exposed portion.

To address this, in the present embodiment, first insulating portion 151 is provided at a position farther away from sealing member 130 than second insulating portion 152. With this configuration, the time required for moisture that has entered from sealing member 130 to reach first insulating portion 151 can be made longer than the time required for the moisture to reach second insulating portion 152 (to be specific, connecting portion 171).

Thus, according to the present embodiment, the lifetime of organic EL device 10 can be extended.

Also, for example, insulating layer 150 has a frame shape extending along the edge portion of organic layer 122, and first insulating portion 151 has a line width shorter than the line width of second insulating portion 152.

Here, the drawing of moisture into first insulating portion 151 can be suppressed more as the distance between first insulating portion 151 and sealing member 130 is increased. However, as the distance between first insulating portion 151 and sealing member 130 is increased, the light emitting region is reduced, or in other words, the non-light emitting region (so-called frame) is increased accordingly.

In contrast, according to the present embodiment, as a result of insulating layer 150 having a wide width and a narrow width, first insulating portion 151 can be spaced farther apart from sealing member 130 than second insulating portion 152. Accordingly, it is unnecessary to reduce the light emitting region more than necessary, and thus the lifetime can be extended while achieving a narrow frame.

Also, for example, organic EL device 10 further includes protective film 161 that covers first insulating portion 151.

With this configuration, because protective film 161 that covers first insulating portion 151 is provided, and it is possible to further suppress a situation in which first insulating portion 151 draws moisture. Accordingly, the lifetime can be further extended.

Here, if protective film 161 is conductive, it is necessary to insulate protective film 161 from second electrode 123. For this reason, as shown in FIG. 2, first insulating portion 151 is partly exposed and in contact with filling member 140, rather than first insulating portion 151 being completely covered with protective film 161.

In this case, there is a possibility that first insulating portion 151 may draw moisture that has passed through filling member 140 from the exposed portion of first insulating portion 151. For this reason, the exposed portion of first insulating portion 151 is provided at a position closer to organic layer 122. With this configuration, the exposed portion can be disposed at a position away from sealing member 130, and the time required for moisture to reach the exposed portion can be extended.

Also, for example, protective film 161 is made of the same material as that of second electrode 123, and is electrically insulated from second electrode 123.

With this configuration, second electrode 123 and protective film 161 can be formed simultaneously, and thus the number of production steps can be reduced, and the production cost can be reduced.

Also, for example, protective film 161 is provided so as to be in contact with first electrode extraction portion 160.

With this configuration, because protective film 161 is conductive, protective film 161 can be used as the auxiliary electrode. Accordingly, the voltage drop within first electrode extraction portion 160 and first electrode 121 can be suppressed, and surface uniformity of light emission can be enhanced.

Also, for example, second electrode 123 is made of a metal material.

With this configuration, in general, metal materials have a lower moisture permeability than resin materials, and it is therefore possible to effectively protect organic layer 122 from moisture that has entered the sealed space.

(Variations)

Hereinafter, a variation of organic EL device 10 according to the embodiment will be described with reference to FIG. 6.

Figure 6:
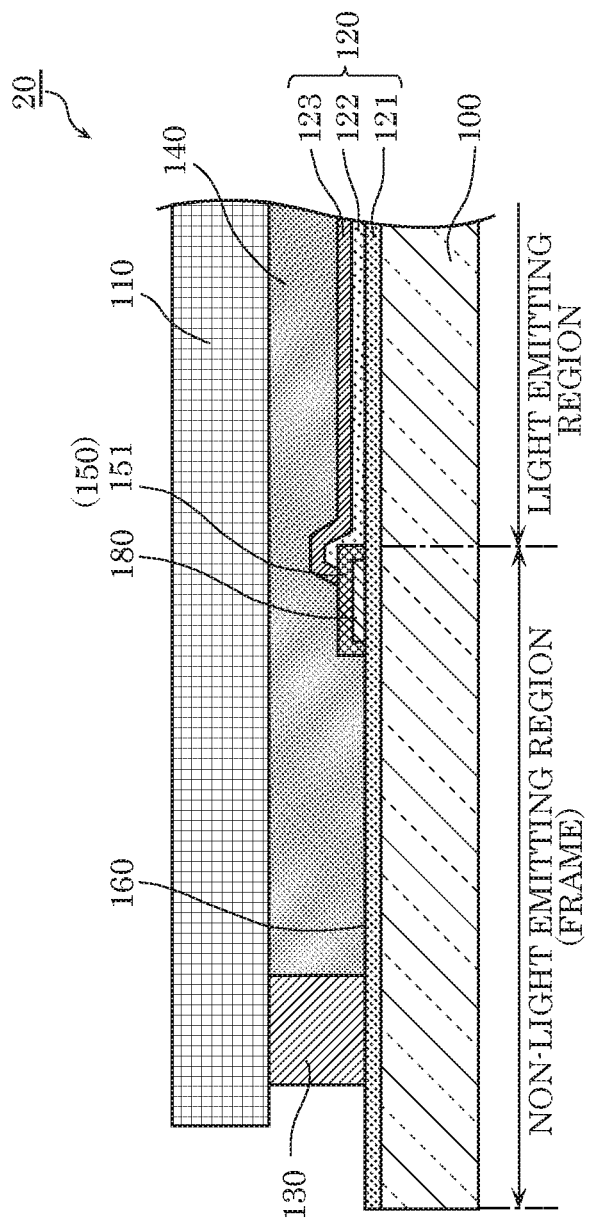
FIG. 6 is a schematic cross-sectional view showing a cross section passing through a first electrode extraction portion according to a variation of Embodiment 1 of the present invention.

FIG. 6 is a schematic cross-sectional view showing a cross section passing through first electrode extraction portion 160 of organic EL device 20 according to a variation of the present embodiment. FIG. 6 shows a cross section corresponding to the cross section taken along the line C-C shown in FIG. 1.

Organic EL device 20 according to the present variation is different from organic EL device 10 shown in FIG. 4 in that protective film 161 is not provided.

Even when protective film 161 is not provided, the distance between first insulating portion 151 and sealing member 130 is long, and thus the time required for moisture that has passed through sealing member 130 and entered the sealed space to reach first insulating portion 151 is longer than the time required for the moisture to reach second insulating portion 152 (to be specific, connecting portion 171). The lifetime of organic EL device 20 can be thereby extended.

Embodiment 2

Next, a lighting apparatus according to Embodiment 2 will be described with reference to FIG. 7.

Figure 7:
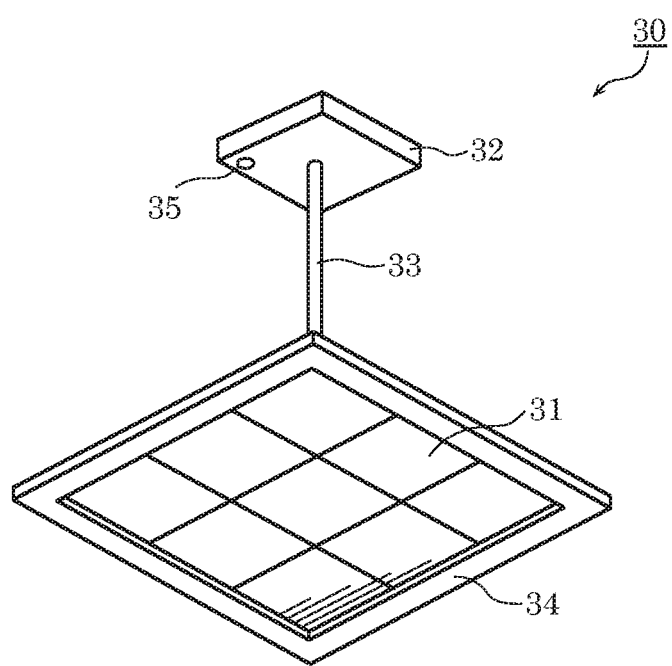
FIG. 7 is an overall perspective view showing a lighting apparatus according to Embodiment 2 of the present invention.

FIG. 7 is an overall perspective view showing lighting apparatus 30 according to the present embodiment.

Lighting apparatus 30 shown in FIG. 7 includes, for example, organic EL device 10. For example, lighting apparatus 30 includes light emitting portion 31 including a plurality of organic EL devices 10, sling 32 for installing light emitting portion 31 onto a ceiling, and power cord 33 connecting light emitting portion 31 and sling 32.

Light emitting portion 31 is configured by, for example, arranging a plurality of organic EL devices 10 adjacent to each other. Also, light emitting portion 31 is protected by its edge portion being covered with light fixture case 34. Sling 32 includes a remote control light receiving portion 35 for receiving, at its surface, a remote control signal received from a remote controller (not shown in the drawing).

As described above, lighting apparatus 30 according to the present embodiment includes, for example, organic EL devices 10 according to Embodiment 1. For this reason, lighting apparatus 30 according to the present embodiment produces the same effects as those of Embodiment 1. That is, the lifetime of organic EL device 10 can be extended, and thus lighting apparatus 30 having a long lifetime can be implemented.

Lighting apparatus 30 does not need to be suspended from a ceiling, and may be installed on a wall. Even with this configuration, the same effects can be obtained.

Other Embodiments

The organic EL device and the method for producing an organic EL device according to the present invention have been described above by way of embodiments and variations thereof, but the present invention is not limited to the embodiments given above.

For example, the embodiments given above have been described by using a hermetically sealing structure in which filling member 140 that covers organic light emitting portion 120 is provided, but the present invention is not limited thereto. For example, organic EL device may have a hollow sealing structure in which filling member 140 is not provided. That is, the sealed space may be a hollow sealed space. The hollow sealed space is maintained, for example, in a reduced pressure condition at the time of lamination of first substrate 100 and second substrate 110.

Also, for example, in the embodiments described above, insulating layer 150 has different line widths to set different distances between insulating layer 150 and sealing member 130, but the present invention is not limited thereto. Different distances may be set between insulating layer 150 and sealing member 130 by disposing insulating layer 150 having a constant line width at different positions. Alternatively, different distances may be set between insulating layer 150 and sealing member 130 by disposing sealing member 130 at different positions.

Also, in the embodiments described above, first electrode extraction portion 160 and first electrode 121 are formed unitarily with each other, but the present invention is not limited thereto. First electrode extraction portion 160 and first electrode 121 may be made of different members. Also, second electrode extraction portion 170 and second electrode 123 may be formed unitarily with each other.

Also, for example, in the embodiments described above, an example was shown in which first electrode 121 serves as the anode and second electrode 123 serves as the cathode, but they may be reversed. That is, first electrode 121 may serve as the cathode and second electrode 123 may serve as the anode.

Also, for example, in the embodiments described above, auxiliary electrode 180 is provided on first electrode 121 and first electrode extraction portion 160, but auxiliary electrode 180 may be provided between first substrate 100 and first electrode 121 and first electrode extraction portion 160.

Also, for example, in the embodiments described above, an example was given in which organic EL device 10 has a rectangular shape as viewed in plan view, but the present invention is not limited thereto. Organic EL device 10 may have, for example, a closed shape formed by a straight line or a curved line such as a polygonal shape, a circular shape or an elliptic shape as viewed in plan view.

Also, for example, the embodiments given above have been described by using bottom emission type organic EL device 10 that emits light on first substrate 100 side, but it is also possible to use a top emission type organic EL device that emits light on second substrate 110 side. In this case, for example, first electrode 121 is made of a light reflective material, and second electrode 123 and second substrate 110 are made of a light transmissive material.

The present invention also encompasses other embodiments obtained by making various modifications that can be conceived by a person having ordinary skill in the art to each of the embodiments, as well as embodiments implemented by any combination of the structural elements and the functions of each of the embodiments without departing from the scope of the present invention.

The invention claimed is:

1. An organic electro-luminescent (EL) device comprising:
    a first substrate and a second substrate that are oppositely disposed;
    an organic light emitting portion provided between the first substrate and the second substrate, the organic light emitting portion including a first electrode, an organic layer including a light emitting layer, and a second electrode that are stacked in sequence on the first substrate;
    a sealing member that connects the first substrate and the second substrate and surrounds the organic light emitting portion;
    a first electrode extraction portion that is partly exposed outside the sealing member and is electrically connected to the first electrode;
    a second electrode extraction portion that is partly exposed outside the sealing member and is electrically connected to the second electrode;
    an insulating layer provided along an edge portion of the organic layer, the insulating layer electrically insulating the first electrode and the second electrode; and
    a connecting portion that electrically connects the second electrode extraction portion and the second electrode,
    wherein the insulating layer includes:
    a first insulating portion provided between the first electrode extraction portion and the organic layer; and
    a second insulating portion provided between the second electrode extraction portion and the organic layer, the second insulating portion being covered with the connecting portion, and
    a distance between the sealing member and the first insulating portion is longer than a distance between the sealing member and the second insulating portion.

2. The organic EL device according to claim 1,
    wherein the insulating layer has a frame shape extending along the edge portion of the organic layer, and
    the first insulating portion has a line width shorter than a line width of the second insulating portion.

3. The organic EL device according to claim 1, further comprising a protective film that covers the first insulating portion.

4. The organic EL device according to claim 3,
    wherein the protective film includes a same material as a material of the second electrode and is electrically insulated from the second electrode.

5. The organic EL device according to claim 4,
    wherein the protective film is in contact with the first electrode extraction portion.

6. The organic EL device according to claim 1,
    wherein the second electrode includes a metal material.

7. A method for producing an organic EL device that includes an organic light emitting portion, the organic light emitting portion including a first electrode, an organic layer including a light emitting layer, and a second electrode that are stacked in sequence, the method comprising:
- forming, on a first substrate, the first electrode, a first electrode extraction portion electrically connected to the first electrode, and a second electrode extraction portion electrically connected to the second electrode;
- forming an insulating layer along an edge portion of the first electrode;
- forming the organic layer on the first electrode;
- forming the second electrode on the organic layer;
- forming a sealing member on at least one of the first substrate and a second substrate so as to surround the organic light emitting portion and cause the first electrode extraction portion and the second electrode extraction portion to be partly exposed outside the sealing member; and
- sealing the organic light emitting portion by laminating the first substrate and the second substrate,
- wherein the insulating layer includes:
  - a first insulating portion provided between the first electrode extraction portion and the organic layer; and
  - a second insulating portion provided between the second electrode extraction portion and the organic layer,
- in the forming of the second electrode, a connecting portion that electrically connects the second electrode and the second electrode extraction portion is further formed on the second insulating portion, and
- in the forming of the insulating layer, the insulating layer is formed such that a distance between the sealing member and the first insulating portion is longer than a distance between the sealing member and the second insulating portion.

8. The method for producing an organic EL device according to claim 7,
- wherein in the forming of the second electrode, a protective film that covers the first insulating portion is further formed on the first insulating portion.

9. The method for producing an organic EL device according to claim 8,
- wherein in the forming of the first electrode, the first electrode extraction portion and the second electrode extraction portion, the first electrode, the first electrode extraction portion and the second electrode extraction portion are formed simultaneously using a same material, and
- in the forming of the insulating layer, the second electrode, the connecting portion and the protective film are formed simultaneously using a same material.

* * * * *